United States Patent [19]

Reiner et al.

[11] Patent Number: 4,906,059
[45] Date of Patent: Mar. 6, 1990

[54] ELECTRICAL APPARATUS CABINET HAVING INTERNAL BARRIER SEAL VISIBLE FROM EXTERIOR OF CABINET

[75] Inventors: Richard A. Reiner, Colgate; John E. Swedowski, Milwaukee; Robert J. Clarey, Brookfield; Kurt R. Van Wormer, Mequon, all of Wis.

[73] Assignee: Eaton Corporation, Cleveland, Ohio

[21] Appl. No.: 289,141

[22] Filed: Dec. 23, 1988

[51] Int. Cl.[4] ............................................. A47B 81/00
[52] U.S. Cl. .................................... 312/291; 312/215
[58] Field of Search ............... 312/291, 215, 222, 100, 312/295, 327; 292/88; 324/110, 156; 70/78; 206/305

[56] References Cited

U.S. PATENT DOCUMENTS

| | | | |
|---|---|---|---|
| 729,595 | 6/1903 | Johnson | 292/88 |
| 863,920 | 8/1907 | Helmer et al. | 292/88 |
| 3,279,871 | 10/1966 | Bright | 324/156 |
| 3,287,079 | 11/1966 | Courson | 312/291 |
| 3,666,340 | 5/1972 | Albeanese, III | 312/291 |
| 4,320,933 | 3/1982 | Felix et al. | 312/291 |
| 4,404,521 | 9/1983 | Fennell | 324/110 |
| 4,616,177 | 10/1986 | McClain et al. | 324/156 |

*Primary Examiner*—Kenneth J. Dorner
*Assistant Examiner*—Brian K. Green
*Attorney, Agent, or Firm*—L. G. Vande Zande

[57] ABSTRACT

One end of an internal barrier assembly is attached to a forward side of a cabinet below a door of the cabinet by bolt and nut fasteners threadably assembled together at the exterior of the cabinet to be readily visible to an observer inspecting similar bolt and nut fasteners for the cabinet door, all such fasteners preferably being disposed on a common face of the cabinet. The bolt and nut fasteners have holes therein through which a wire loop of a lead security seal is wound and the integrity of all seals may be visibly observed without opening the door.

7 Claims, 2 Drawing Sheets

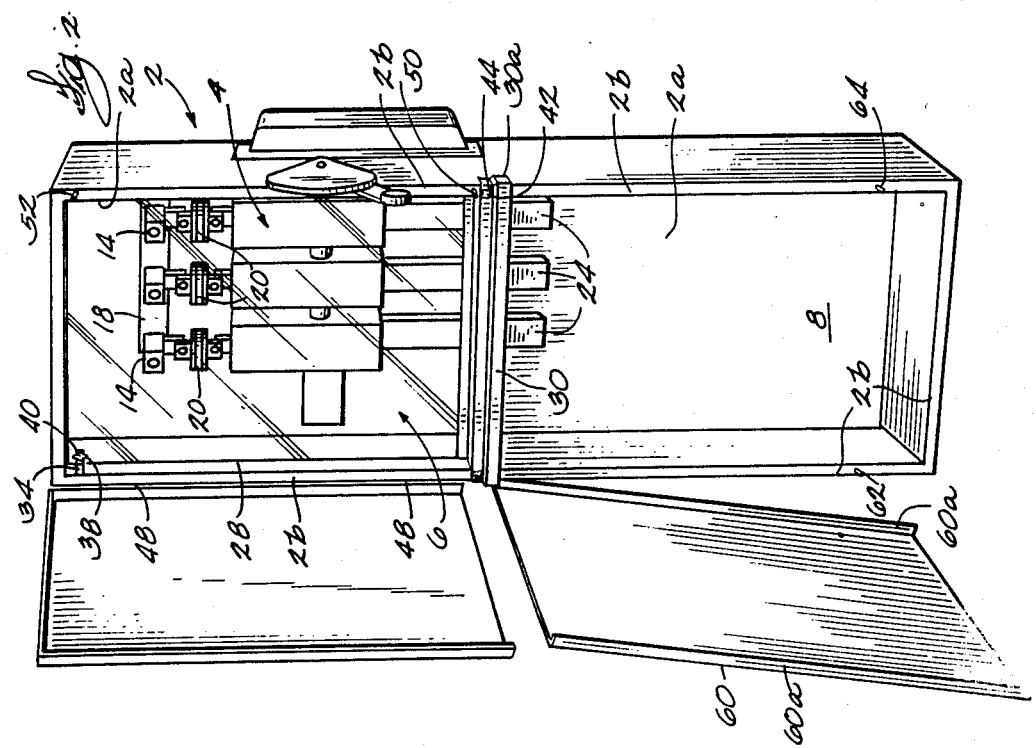
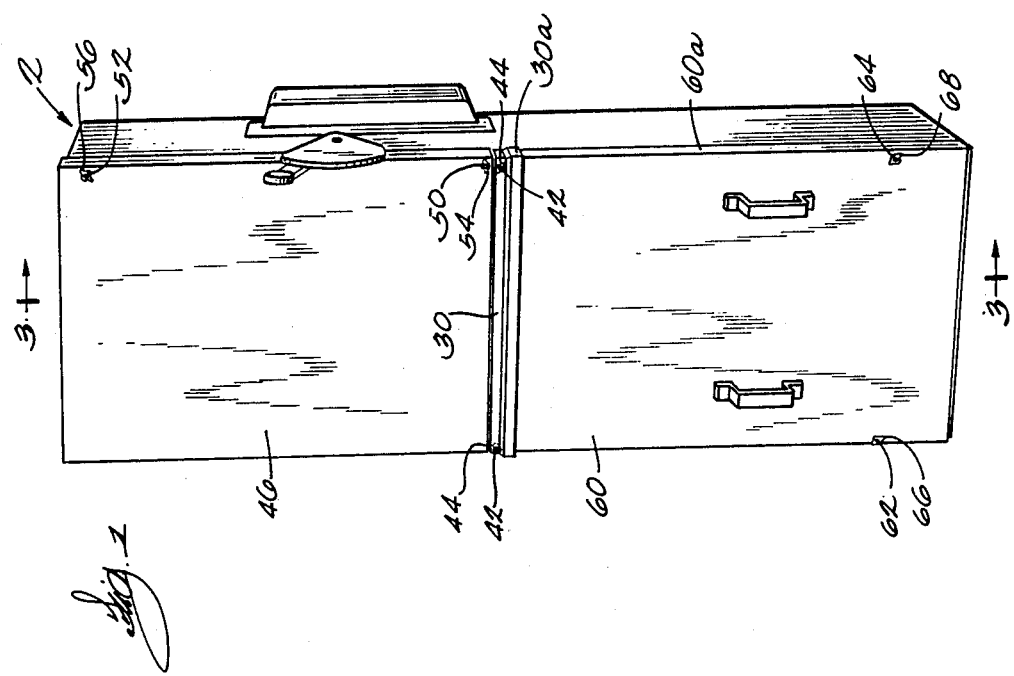

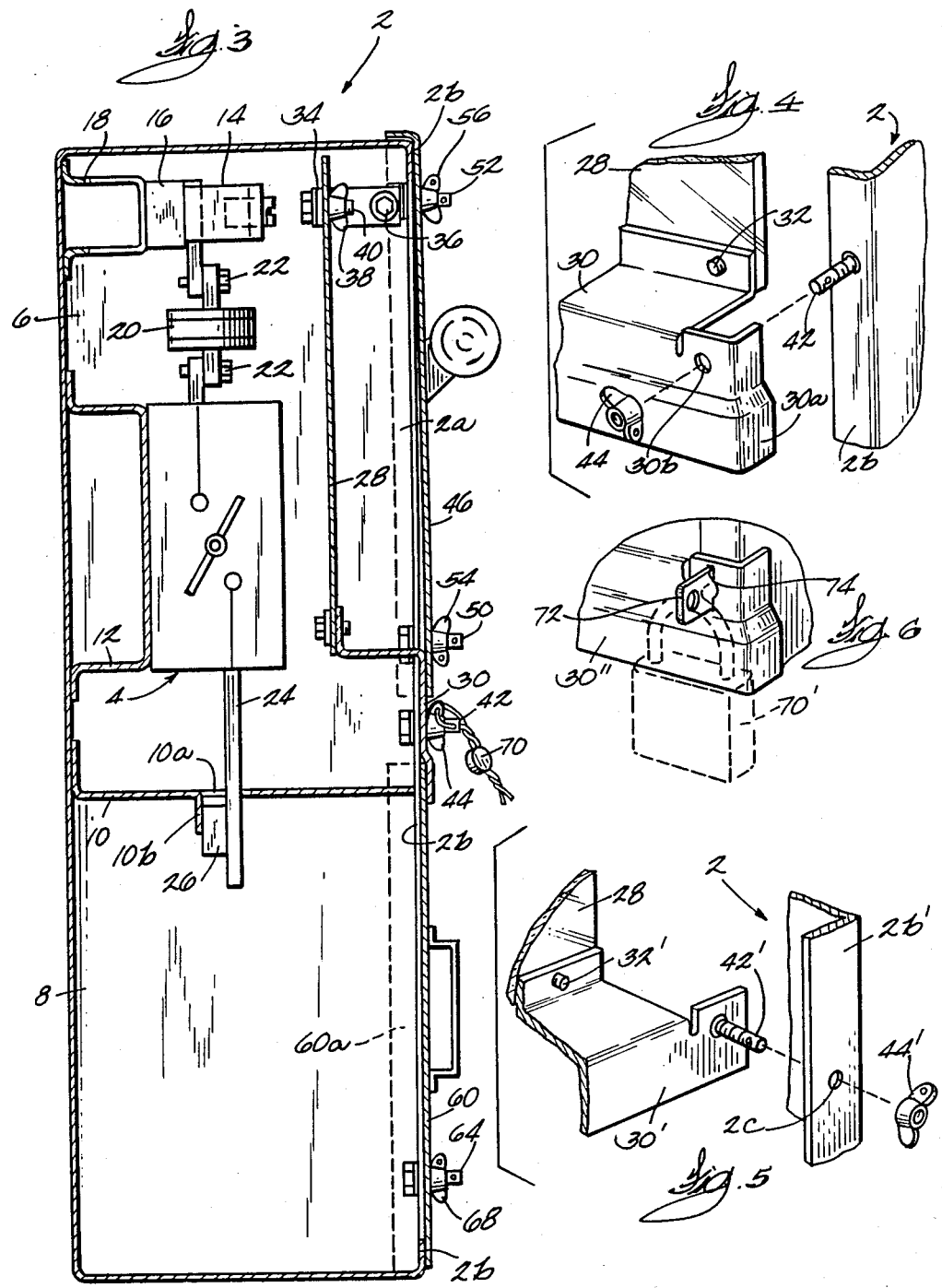

ELECTRICAL APPARATUS CABINET HAVING INTERNAL BARRIER SEAL VISIBLE FROM EXTERIOR OF CABINET

BACKGROUND OF THE INVENTION

This invention relates to cabinet enclosures for electrical apparatus such as electrical switching apparatus which may be used as service entrance equipment or similar apparatus positioned ahead of a watthour meter. Such enclosures are sealed shut by an electrical utility to prevent unauthorized access to electrical power. More particularly, the invention relates to such apparatus wherein the cabinet is provided with an internal barrier overlying the electrical apparatus providing limited access to the apparatus through an open side of the cabinet. An external cabinet door closes off the open side of the cabinet. Both the door and the internal barrier are sealed by the utility to restrict the unauthorized taking of electrical power from the apparatus.

It is preferred or desirable that the seal for the internal barrier be visible and inspectable from the exterior of the cabinet indicating that the internal barrier is in place, has not been tampered with and is still sealed without breaking the seals for the door and opening the door to visibly inspect the barrier and its seals.

SUMMARY OF THE INVENTION

This invention provides a cabinet for enclosing electrical apparatus wherein the cabinet is provided with a door closable over an open side of the cabinet and having fastening means for securing the door, the fastening means being capable of receiving a seal or other security device, and a barrier within the cabinet behind the door which is fastened or attached to the cabinet by fastening means, at least some of which are visible externally of the cabinet and receive a security device thereon. One end of the internal barrier is attached to the cabinet adjacent an open front side wherein threaded fastener means project externally of the cabinet to receive a nut thereon, the nut and fastener having openings through which a wire seal may be affixed. The cabinet may be a two compartment structure wherein a structural member of the internal barrier may extend to the exterior of the cabinet below an upper door and overlie a lower door to prohibit removal of the lower door without destruction of the seal. The invention will become more clear when reading the following description and claims in conjunction with the accompanying drawings.

BRIEF DESCRIPTION OF THE DRAWINGS

FIG. 1 is a perspective view of an electrical apparatus cabinet constructed in accordance with this invention having cover members of two compartments of the cabinet and an internal barrier in place;

FIG. 2 is a perspective view like FIG. 1 but showing the covers of the respective compartments in their open or removed positions, more particularly disclosing the internal barrier;

FIG. 3 is a schematic illustration in cross section taken generally along the line 3—3 in FIG. 1;

FIG. 4 is a fragmentary perspective view showing a portion of the cabinet and a portion of the barrier mounting strap together with fastening means for securing the barrier strap to the apparatus;

FIG. 5 is a view similar to FIG. 4 but showing an alternative method of attachment of said barrier mounting strap to said enclosure; and FIG. 6 is a view similar to FIGS. 4 and 5 showing still another alternative method of attachment of said barrier mounting strap to said enclosure.

DESCRIPTION OF THE PREFERRED EMBODIMENT

A cabinet 2 for electrical apparatus such as a fusible service disconnect switch 4 or the like is shown in the drawings. The particular cabinet 2 which is shown in the drawings is divided into an upper compartment 6 and a lower compartment 8 by a transversely extending wall 10 as seen in FIG. 3. The switching apparatus is disposed within upper compartment 6 and comprises the aforementioned disconnect switch 4 mounted on a channel 12 secured to a rear wall of cabinet 2 and a plurality of wiring connectors 14 secured on insulators 16 which in turn are mounted to a channel 18 attached to the rear wall of cabinet 2. Fuses 20 (only one of which is visible in FIG. 3) are connected between one side of the switch 4 and the wiring connectors 14 by screws 22. A connector strap 24 extends from an opposite side of switch 4 through an opening 10a in dividing wall 10 and is supported on a flange 10b of wall 10 by an intermediary insulator 26. Connector 24 may have a wiring lug or other type of pressure connector affixed thereto within lower compartment 8.

Cabinet 2 is open to its front side such as at opening 2a. A short peripheral flange 2b extends around the opening 2a in the plane of the front side. An internal barrier assembly comprising a transparent barrier 28 and an elongated metal mounting strap 30 are fastened together by a plurality of screws 32 extending from the back side of barrier 28 through clearance holes therein and threading into holes in strap 30. The upper end of barrier 28 overlies L-shaped brackets 34 (only one of which is visible in FIG. 3) which are attached to the interior surface of the side walls of cabinet 2 at the upper ends thereof by screws 36. A threaded post extends from the laterally extending leg of bracket 34 toward the open side of cabinet 2 to project through clearance openings in barrier 28 and receive a wing nut 38 thereon to secure the upper end of barrier 28 to cabinet 2. The threaded post may be the threaded shank of a screw 40 which may be threaded into an opening in the lateral leg of bracket 34 or may be attached thereto by welding or other suitable means.

The mounting strap 30 is essentially Z-shaped in cross section and in the preferred embodiment extends forwardly to the open side of cabinet 2 through the opening 2a. The forward surface of strap 30 extends across the entire width of cabinet 2 and has wrap-around portions 30a (FIG. 4) to extend around the forward corners of the cabinet and overlap the sides thereof. The forward surface of mounting strap 30 is also provided with holes 30b (FIG. 4) at the opposite ends to extend over threaded posts 42 which extend forwardly through the front face of flange 2b at opposite sides of the cabinet. The post 42 may be a threaded shank of a screw which is either threaded through a hole in the flange 2b or is welded or similarly attached to the flange at the interior side thereof. A wing nut 44 is attached to the post 42 to secure the mounting strap 30 to the cabinet 2, thereby attaching the lower end of barrier 28 to the cabinet. The barrier substantially closes off the cabinet between the electrical apparatus and the open side 2a.

A door 46 is attached to cabinet 2 by hinges 48 (FIG. 2) at the left-hand side of the door to cover the open front side of the cabinet 2 in the area of upper compartment 6. Door 46 is provided with a pair of openings along its right-hand edge which, when the door is closed, extend over threaded posts 50 and 52 which are mounted to the flange 2b of the cabinet similarly to post 42. Wing nuts 54 and 56 are secured to the posts 50 and 52 respectively, to secure the door 46 over the open side of the upper compartment of cabinet 2.

A cover 60 is disposed over the open side of cabinet 2 at the lower compartment 8. The cover 60 has short legs 60a (FIGS. 2 and 3) extending along the opposite sides thereof to overlap the front corners of the cabinet and extend along the sides thereof. As seen particularly in FIGS. 3 and 4, mounting strap 30 is offset outwardly along its lower edge to receive the upper edge of cover 60 between the front surface of cabinet 2 and the offset portion of mounting strap 30, thereby securing the upper edge of the cover to the cabinet and providing a rain tight configuration for the cover. A pair of threaded posts 62 and 64 are secured to the flanges 2b at the opposite sides of the cabinet near the lower ends thereof. The posts 62 and 64 project through clearance holes in the cover 60 and receive wing nuts 66, 68 thereon to secure the cover in place.

In a manner well known in the art, posts 42, 50, 52, 62 and 64 and the respective associated wing nuts 44, 54, 56, 64 and 68 are provided with holes through which a wire of a security device such as a lead seal 70 (FIG. 3) may be wound to seal the cabinet shut, preventing opening thereof without destruction of the seal. The provision of mounting strap 30 extending to the exterior of the cabinet below the edge of door 46 locates the fastener means 42, 44 and the associated sealing means 70 at the exterior of the cabinet so that the integrity of the seal for internal barrier 28 may be inspected from the exterior of the cabinet without a need for breaking the similar seals on fastening means 50, 54 and 52, 56 to open door 46 and thereby inspect the seal for the barrier 28.

An alternative embodiment is disclosed in FIG. 5 wherein the mounting strap 30' does not extend to the exterior side of flange 2b, but instead is abutted against the interior surface thereof. The fastening means comprising threaded post 42' is affixed to the mounting strap 30' to extend through clearance openings 2c in flange 2b' to receive wing nut 44' thereon. Another modification contemplated within this description provides padlock or similar security devices 70' insertable into holes of tongues 72 or similar projections extending through slots 74 in the cabinet, door or mounting strap 30" as shown in FIG. 6. It is to be understood that the cabinet and barrier sealing means described herein are susceptible of various other modifications to accomplish external visibility of the seal for the barrier without departing from the scope of the appended claims.

We claim:

1. A cabinet enclosing electrical apparatus, said cabinet having an open side and inwardly directed flanges extending toward each other at opposite edges of said open side, a cover attached to said cabinet overlying said flanges and closing off said open side, first fastening means on said cabinet projecting through an opening in said cover, said first fastening means having means providing for attachment of a security device thereto exteriorly of said cabinet and cover, a barrier disposed within said cabinet substantially closing off said cabinet between said apparatus and said open side, said barrier comprising mounting strap means spanning said open side and engaging said flanges, said barrier being attached to said cabinet by second fastening means at least one of which projects exteriorly of said cabinet and has means providing for attachment of a security device thereto exteriorly of said cabinet.

2. The cabinet defined in claim 1 wherein said mounting strap means abuts interior surfaces of means providing for attachment of a security device comprises threaded posts affixed to said mounting strap means projecting through respective openings in said flanges and nuts threadably engaged on said posts exteriorly of said cabinet.

3. The cabinet defined in claim 1 wherein said second fastening means secure only said barrier to said cabinet and said cover is openable independently of said second fastening means by releasing said first fastening means.

4. A cabinet enclosing electrical apparatus, said cabinet having an open side and flanges at opposite edges of said open side, a cover attached to said cabinet closing off said open side, first fastening means on said cabinet projecting through an opening in said cover, said first fastening means having means providing for attachment of a security device thereto exteriorly of said cabinet and cover, a barrier disposed within said cabinet substantially closing off said cabinet between said apparatus and said open side, said barrier comprising mounting strap means projecting through said open side and overlying said flanges in engagement therewith, said barrier being attached to said cabinet by second fastening means, at least one of which projects exteriorly of said cabinet and has means providing for attachment of a security device thereto exteriorly of said cabinet, said second fastening means having said means providing for attachment of a security device comprising threaded posts affixed to said flanges projecting through respective openings in said mounting strap means and nuts threadably engaged on said posts exteriorly of said cabinet.

5. The cabinet defined in claim 4 wherein said mounting strap means comprises an elongated member disposed across said open side of said cabinet in juxtaposition to an exterior edge of said cover, opposite ends of said elongated member disposed over said flanges.

6. The cabinet defined in claim 5 further comprising an intermediate wall secured within said cabinet extending to said open side, said wall dividing said cabinet into first and second compartments, said mounting strap elongated member overlying an edge of said wall adjacent said open side of said cabinet and being offset outwardly along an edge thereof adjacent said second compartment, said cover closing off said open side of said cabinet at said first compartment, and a second cover attached to said cabinet closing off said open side of said cabinet at said second compartment, one edge of said second cover being retained between said cabinet and said elongated member offset edge, and third fastening means comprising threaded posts affixed to said flanges projecting through openings in said second cover and nuts threadably engaged on said posts exteriorly of said cabinet.

7. The cabinet defined in claim 6 wherein said third fastening means comprises means providing for attachment of a security device thereto.

* * * * *